United States Patent [19]

Baba

[11] 4,198,606
[45] Apr. 15, 1980

[54] TUNING APPARATUS
[75] Inventor: Michiru Baba, Hamamatsu, Japan
[73] Assignee: Nippon Gakki Seizo Kabushiki Kaisha, Hamamatsu, Japan
[21] Appl. No.: 915,758
[22] Filed: Jun. 15, 1978
[30] Foreign Application Priority Data Jun. 21, 1977 [JP] Japan .................................. 52-73642

[51] Int. Cl.$^2$ ......................... H03K 9/06; G10G 7/02
[52] U.S. Cl. .................................. 328/141; 324/79 R; 324/81; 84/454
[58] Field of Search ............... 328/141; 324/81, 79 R; 84/454

[56] References Cited

U.S. PATENT DOCUMENTS

| | | | |
|---|---|---|---|
| 3,722,353 | 3/1973 | Westhaver | 324/79 R |
| 3,968,719 | 7/1976 | Sanderson | 84/454 |
| 4,019,419 | 4/1977 | Yoshikawa et al. | 84/454 |

Primary Examiner—John S. Heyman
Attorney, Agent, or Firm—Koda and Androlia

[57] ABSTRACT

A fundamental frequency detection device generates a fundamental frequency pulse signal having a frequency corresponding to the fundamental frequency of a signal to be tuned. The fundamental frequency pulse signal is converted to a first pulse signal having a pulse width corresponding to the fundamental frequency. The pulse width of this first pulse signal is compared with that of a second pulse signal of such a pulse width as to correspond to the frequency of a reference sound signal. A deviation signal expressing the frequency deviation between the signal to be tuned and the reference sound signal is obtained by counting cent value-corresponding pulses during the period corresponding to the difference of the pulse width between the first and second pulse signals.

4 Claims, 7 Drawing Figures

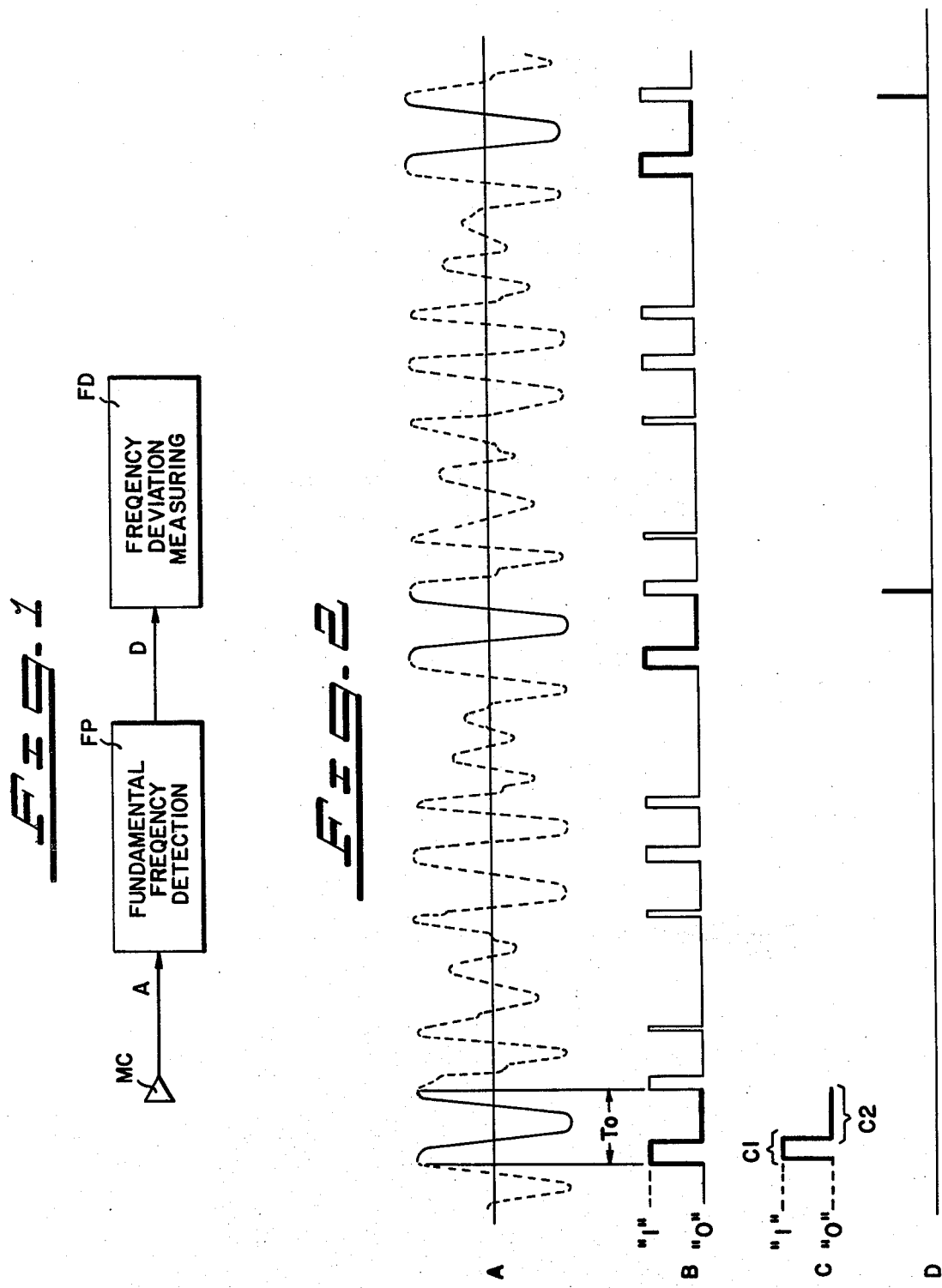

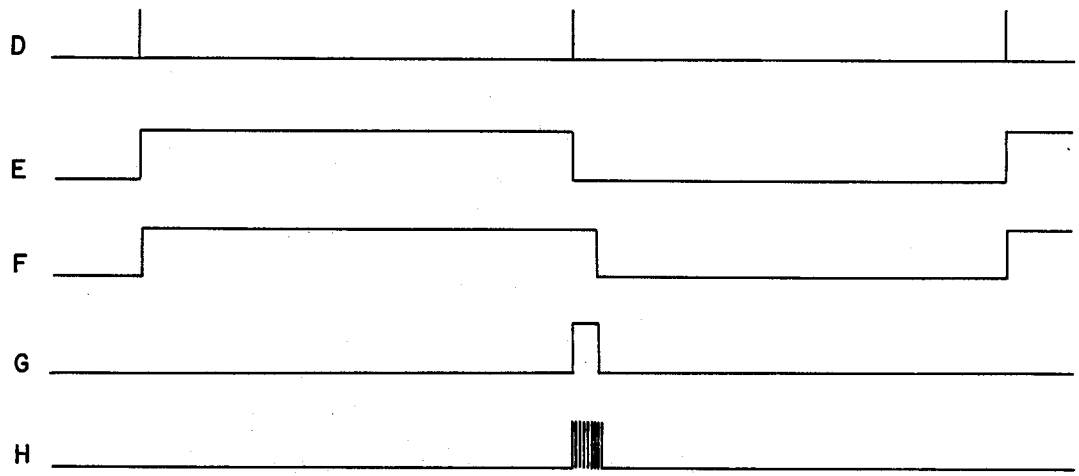
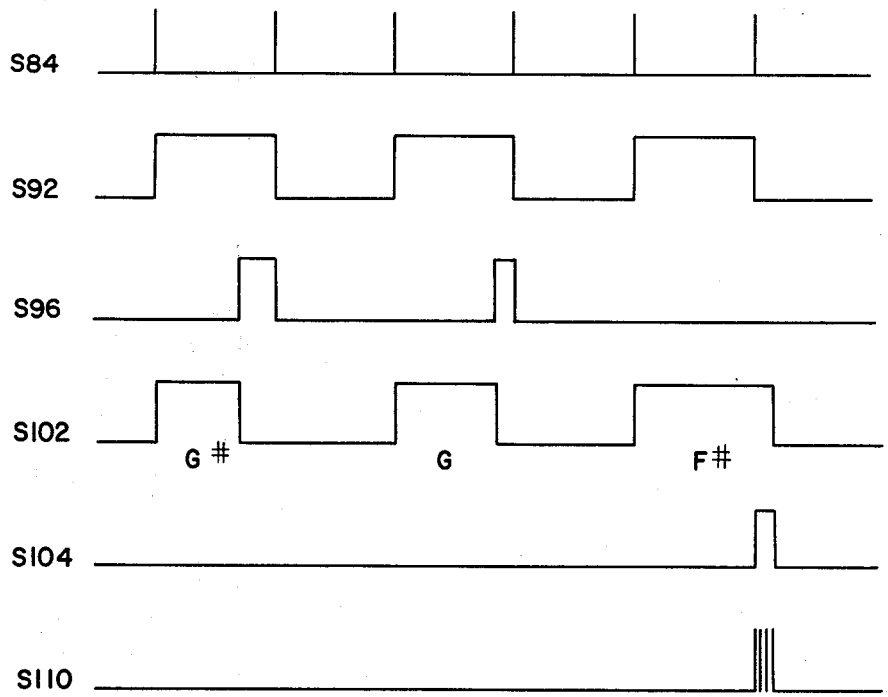

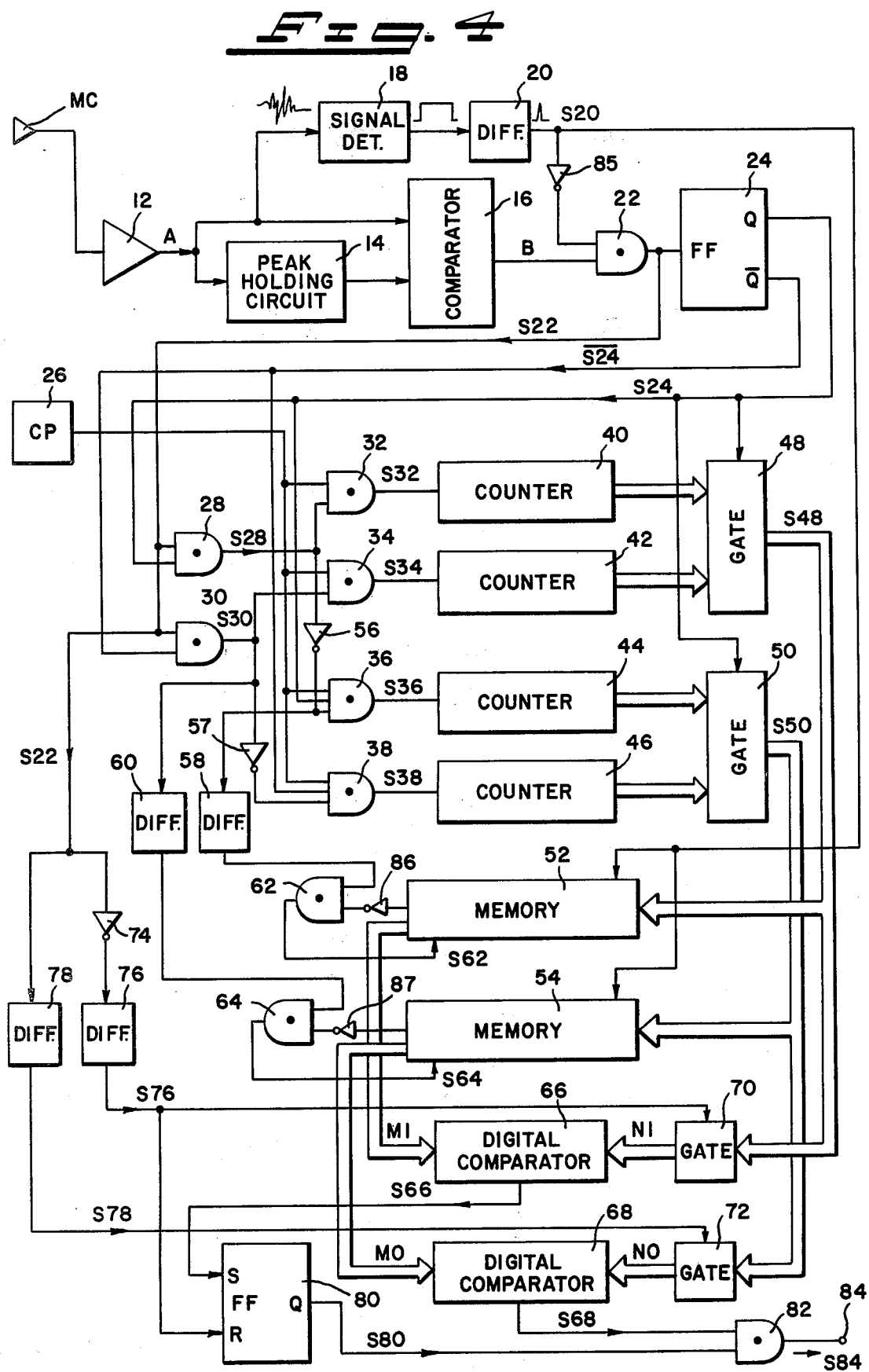

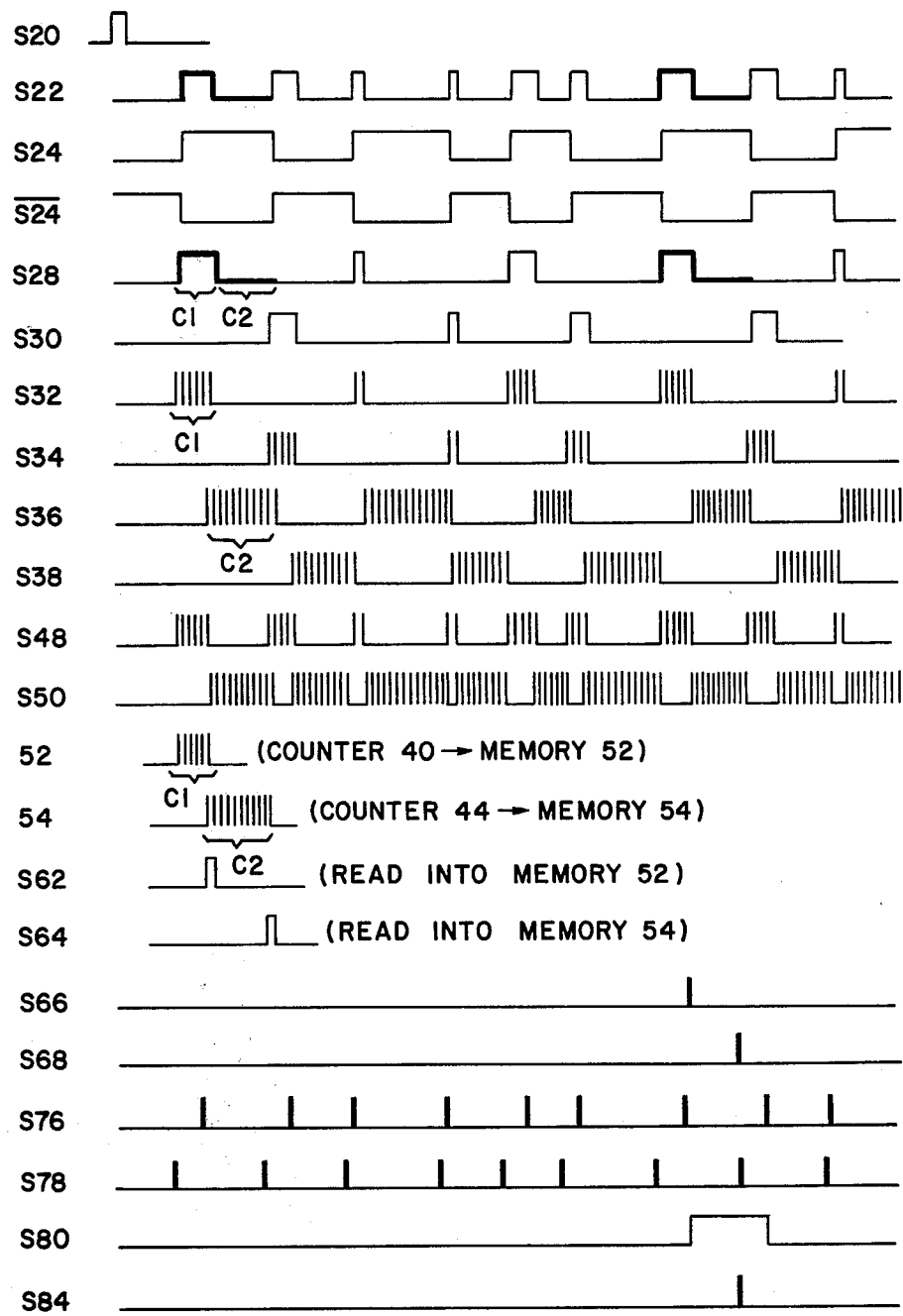

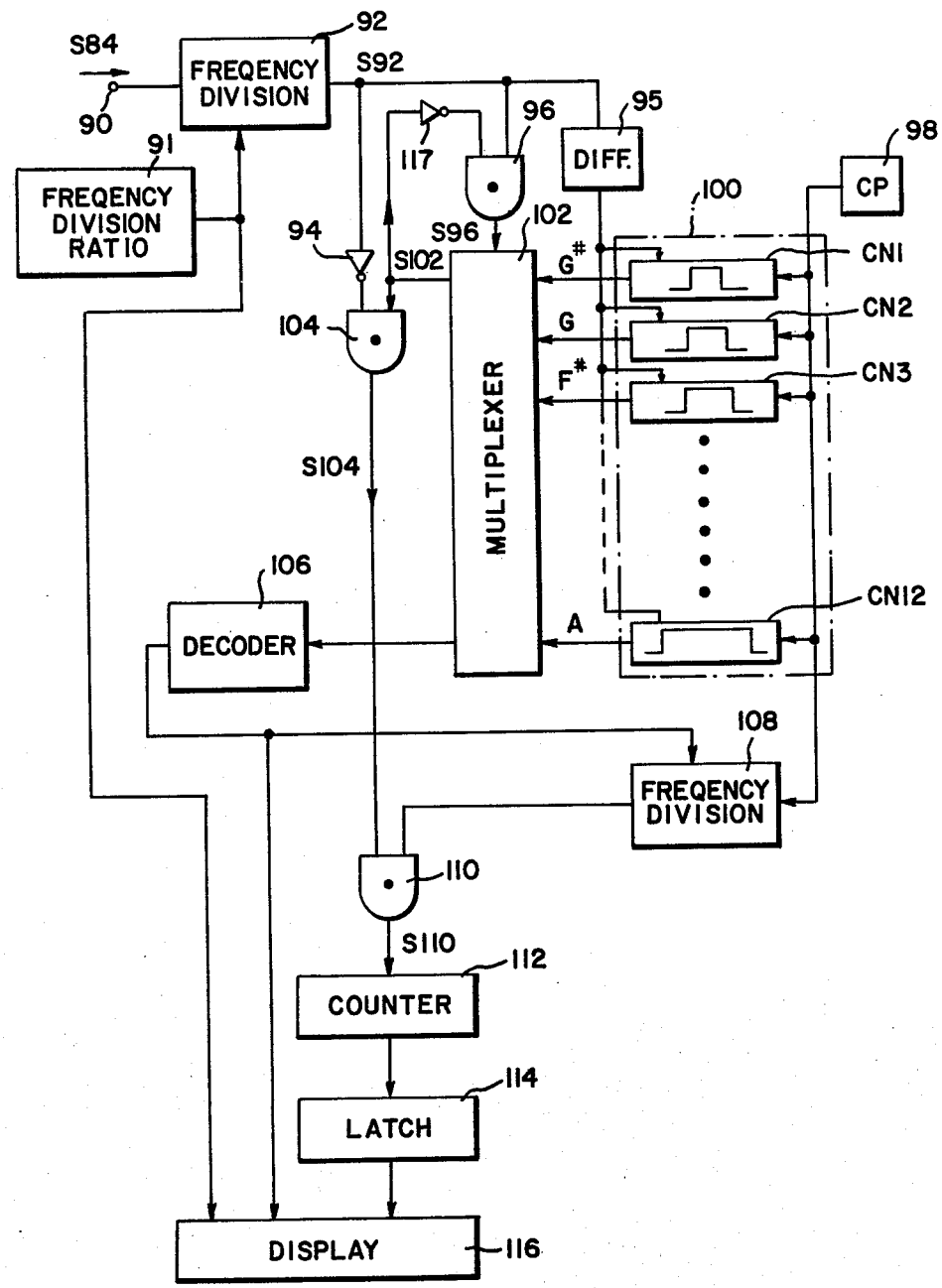

TUNING APPARATUS

BACKGROUND OF THE INVENTION

1. Field of the Invention

This invention relates to an apparatus for measuring the frequency deviation between a reference sound and a sound to be measured for the purpose of tuning a musical instrument and the like. More specifically, the present invention relates to a digital tuning apparatus which directly expresses the frequency deviation in terms of a cent value.

2. Prior Art

Various tuning apparatus have heretofore been proposed. Among them is a relatively new type which extracts a fundamental wave from a signal to be tuned by use of filters, etc., and obtains the difference of frequency between the fundamental wave and a reference sound by means of analog operation so as to display it on a meter. However, the apparatus of this kind involves such problems that extra time and labor are necessary in order to convert the frequency deviation displayed on the meter into a cent value, and it is difficult to create the apparatus compact in size and to sufficiently enhance the measuring accuracy.

SUMMARY OF THE INVENTION

Accordingly, it is a general object of the present invention to provide a digital tuning apparatus of a compact size and high accuracy which eliminates the abovementioned drawbacks and is capable of directly expressing the frequency deviation in terms of a cent value.

It is one of the characteristic features of the present invention that a first pulse signal having a pulse width corresponding to the periodicity of the fundamental wave of a signal to be tuned is generated and at the same time, a second pulse signal having a pulse width corresponding to the periodicity of a reference sound is generated in order to count cent value-corresponding pulses during the period corresponding to the difference of the pulse width of the first and second pulse signals. The cent value-corresponding pulses are generated with a frequency so selected as to express one cent with respect to the reference sound. By counting these cent value-corresponding pulses during the period corresponding to the abovementioned differential pulse width, it is therefore possible to obtain in terms of a cent value, a deviation signal expressing the difference of periodicity betwen the fundamental wave and the reference sound, that is to say, the frequency deviation between the signal to be tuned and the reference sound.

In conjunction with the abovementioned first feature, another feature of the present invention resides in the use of an improved fundamental frequency detection device in order to construct the apparatus as a whole using digital circuits, reduce its size and enhance its accuracy to a marked extent. In this device, the signal to be tuned is converted to a fundamental frequency-containing pulse signal by the combination of a peak-holding circuit with a comparator and a fundamental frequency pulse signal having a frequency corresponding to that of the fundamental wave is then generated by digital circuit techniques. Accordingly, it is possible to easily obtain a pulse signal having a pulse width corresponding to the periodicity of the fundamental frequency pulse signal by halving the frequency of this fundamental frequency pulse signal or by some other like method.

In accordance with the abovementioned features of the present invention, it is easy to create a tuning apparatus which is small in size, light in weight and portable and which has low power consumption and high accuracy of measurement.

BRIEF DESCRIPTION OF THE DRAWINGS

These and other objects, features and advantages of the present invention will be made more apparent from the following explanation of preferred embodiments thereof taken in conjunction with the accompanying drawings in which:

FIG. 1 is a block diagram showing the schematic construction of the tuning apparatus in accordance with one embodiment of the present invention;

FIG. 2 is a time chart for explaining the extracting operation of the fundamental frequency;

FIG. 3 is a time chart for explaining the measurement of the frequency deviation;

FIG. 4 is a block diagram showing the construction of the fundamental frequency detection device in the apparatus shown in FIG. 1;

FIG. 5 is a time chart for explaining the operation of the device shown in FIG. 4;

FIG. 6 is a block diagram showing the construction of the device for measuring the frequency deviation in the apparatus shown in FIG. 1; and FIG. 7 is a time chart for explaining the operation of the device shown in FIG. 6.

DETAILED DESCRIPTION OF THE INVENTION

FIG. 1 illustrates a schematic block diagram of a tuning apparatus in accordance with one embodiment of the present invention wherein MC is an acoustic-electric converter such as a microphone for detecting a sound to be measured, e.g., a musical tone, and converting it into a corresponding electric signal A (signal to be tuned) and FP is a fundamental frequency detection device which detects the fundamental frequency of the signal A to be tuned and generates a fundamental frequency signal D by such operation as will be later explained with reference to FIG. 2. FD is a frequency deviation measuring device which digitally obtains the deviation of the frequency of the fundamental frequency pulse signal from that of the reference sound signal and is capable of directly expressing the deviation in terms of a cent value by such action as will be later explained with reference to FIG. 3.

The principle of operation of the frequency detection device FP shown in FIG. 1 will now be explained with reference to FIG. 2. The signal A to be tuned of which the fundamental frequency is to be detected is first passed through a peak-holding circuit of the rapid charge and slow discharge type. In this peak-holding circuit, the peak amplitude value of the input signal A is held in a capacitor which discharges at such a predetermined time constant as to establish a relatively slow discharge speed. When a succeeding amplitude value of the signal A is smaller than the previously held but slightly reduced in value, this held value is maintained in the peak-holding circuit while continuing to discharge at the predetermined speed. If a new amplitude value of the signal A is larger than the held value at that moment, the peak-holding circuit renews its holding value to be the newly received value and the newly held value also falls at the predetermined speed. This discharging characteristic of the peak-holding circuit is necessitated since a sound to be tuned is mainly of a natural acoustic musical instrument which generally produces a decaying characteristic sound.

The value held in the peak-holding ciruit is compared with the signal A by a comparator. The comparator used herein is of such a type that compares an instantaneous amplitude value of the signal A with the peak value thus held as the reference, and the comparator output is raised to a high level when the amplitude value of the signal A equals or exceeds the held reference value, as shown by a pulse train signal B. The period $T_o$ in a part of the input wave form stressed by the full line in the signal A corresponds to the sum of the "1" level period and the succeeding "0" level period in the pulse signal B.

Since the pulse signal B contains those pulses which correspond to the peak positions of the input signal A, it contains component of the fundamental frequency. However, this pulse signal B itself is not capable of directly indicating the periodicity or frequency of the fundamental wave. For this reason, the present invention memorizes the characteristic of the fundamental frequency in the form of first and second periods respectively expressed by the adjacent "1" and "0" levels of the pulse signal B, compares sequentially the first and second periods thus stored with the succeeding "1" and "0" level periods of the signals B and generates a fundamental frequency pulse signal having a frequency corresponding to the fundamental frequency when the first and second periods coincide with other adjacent pairs of "1" and "0" level periods. C in FIG. 2 represents a signal which is to be stored, and the period $C_1$ of the "1" level and the period $C_2$ of adajcent "0" level are stored in memories in the form of digital signals. A digital comparator compares if the succeeding "1" and "0" level periods coincide with the periods $C_1$ and $C_2$ respectively and generates the fundamental frequency pulse signal as indicated by D in FIG. 1 when they coincide.

As can be clearly seen from FIG. 2, the pulse signal D consists of a train of pulses that are generated corresponding to the peak positions of the same feature repeatedly appearing with a predetermined periodicity, among the peak positions held, and has a period or a frequency corresponding to that of the fundamental wave.

One of the features of the abovementioned fundamental frequency detection device is that the signal to be tuned is converted to the fundamental frequency-containing pulse signal by means of the peak-holding circuit and the comparator. The peak-holding circuit detects a peak value of an a.c. input wave form of the signal to be tuned and holds the same while the comparator compares the instantaneous value of the a.c. input signal with the peak value thus held as a reference value and generates a binary pulse signal changing from one level to the other when the a.c. input signal equals or passes the reference value.

Generally, the signal to be tuned varies its amplitude (height of wave form) with the lapse of time and is not necessarily applied as an input with a constant amplitude. In order to detect the fundamental frequency of such an input signal, the following requirements must be satisfied:

1. The fundamental frequency information, i.e., the fundamental frequency-containing pulse signal, must be obtained irrespective of the variation of the amplitude;
2. The fundamental frequency information should not be affected by the variation of the amplitude;
3. The fundamental frequency information should not include too much information about harmonics and/or noises contained in the input signal; and
4. The fundamental frequency information must be correct.

These requirements are satisfied by the combination of the aforementioned peak-holding circuit and the comparator in accordance with the present invention, the held value of the peak-holding circuit is suitably renewed and decayed and comparison is made using the held value as a reference value so as to detect only the information relating to the peak position higher than certain levels. Consequently, it is possible to effectively obtain the digital fundamental frequency information, that is, the fundamental frequency-containing pulse signal.

Another feature of the abovementioned fundamental frequency detection device is that it detects the periods expressed by two adjacent high and low levels of the fundamental frequency-containing pulse signal, stores at least one period so detected and sequentially compares the period thus stored with corresponding other periods of the pulse signal so as to generate a coincidence pulse, or the fundamental frequency pulse signal, when they coincide with each other. In this case, the period to be stored is not specifically restricted to one period. In order to store plural periods, however, it is necessary to increase the memory capacity.

According to this second feature of the detection device, it is possible to realize as a digital circuit the circuit for obtaining the fundamental frequency pulse signal from the fundamental frequency-containing pulse signal. This is extremely advantageous to provide the fundamental frequency detection device with high speed and accuracy of measurement and with a compact size.

Next, the action of the frequency deviation measuring device FD of the apparatus shown in FIG. 1 will be generally explained with reference to FIG. 3. First, the fundamental frequency pulse signal D is subjected to a frequency division by a ½ frequency dividing circuit, thereby giving a pulse signal E having a pulse width corresponding to the periodicity of the fundamental wave. Separately, a pulse signal F of a reference sound (sound having an accurate pitch tuned in advance) is prepared, the pulse signal F having such a pulse width as to correspond to the periodicity of the reference sound. The width of the pulse signal F is compared with that of the pulse signal F so as to generate a pulse signal G having a pulse width corresponding to the difference of the width between the signals E and F. During the period corresponding to the pulse width of this pulse signal G, cent value-corresponding pulses that have separately been generated are counted by a counter, thereby enabling one to obtain a deviation signal which expresses the deviation in a cent value. FIG. 3-H represents the cent value-corresponding pulses to be counted by the counter in this example. Since the frequency of the pulse corresponding to a cent value varies with the pitch of the reference sound, the frequency of the cent value-corresponding pulse is specifically determined depending on the pitch of the reference sound.

The main feature of the abovementioned frequency deviation measuring device is that since it can generate a signal expressing the deviation directly in a cent value, the cent value deviation can be directly read when the deviation signal is displayed on an indicator. Consequently, the tuning operation can be made in an extremely easy manner. Another feature is that since the overall construction can be accomplished by the use of digital circuits, it is easy to furnish the measuring device with high speed and accuracy of measurement and a compact size. Accordingly, it is possible to provide the tuning apparatus with a compact size and high performance in conjunction with the aforementioned fundamental frequency detection device designed in the digital circuit configuration.

Next, the construction and operation of the fundamental frequency detection device shown in FIG. 2 will be explained in further detail with reference to FIGS. 4 and 5.

In FIG. 4, the acoustic-electric converter MC such as a microphone for detecting the sound of a musical instrument as the object for tuning is connected to the input terminal of amplifier 12 and hence, the signal A to be tuned is amplified by the amplifier 12. The amplifier output A corresponds to that shown in FIG. 2-A. This signal A is applied as input to the peak-holding circuit 14 and also applied as input to the comparator 16 and a signal detector 18. The comparator 16 also receives the output of the peak holding circuit 14 and compares the instantaneous amplitude value of the signal A with the peak value held as a reference value. The output of the comparator 16 (fundamental frequency-containing pulse signal B) corresponds to that shown in FIG. 2-B.

The signal detector 18 detects the signal A and generates a pulse output, and the rise of the pulse output is differentiated by a differentiating circuit 20. The differential output signal S20 is passed to an AND gate 22 through an inverter 85 to set the output S22 of the AND gate 22 to a low level and is passed to memories 52 and 54 to reset them. The output S22 (fundamental frequency-containing pulse signal) of the AND gate 22 is supplied respectively to AND gates 28 and 30 on one hand and frequency-divided by a ½ frequency divider 24 consisting of a flip-flop on the other. The Q output signal S24 and the $\bar{Q}$ output signal $\overline{S24}$ of the frequency divider 24 are also fed respectively to the AND gates 28 and 30. The output S28 of the AND gate 28 and the output S30 of the AND gate 30 respectively consist of a train of pulses alternately extracted from the pulses of the signal S22 at the timings of S24 and $\overline{S24}$. Such output pulses are generated in order to obtain in each of the AND gates 32, 34, 36 and 38 a pulse train of a pulse number proportional to each period in a series of periods of the fundamental frequency-containing pulse signal 22.

A clock pulse from a clock pulse source 26 is fed to the first input terminal of each of the AND gates 32, 34, 36 and 38. The output S28 of the AND gate 28 and the output S30 of the AND gate 30 are respectively applied to the second terminal of the AND gate 32 and that of the AND gate 34. On the other hand, the signal S24 and the signal $\overline{S28}$ obtained by inverting the signal S28 by an inverter 56 are respectively applied to the second and third input terminals of the AND gate 36, and the signal $\overline{S24}$ and the signal $\overline{S30}$ obtained by inverting the signal S30 by an invertor 57 are respectively applied to the second and third input terminals of the AND gate 38.

Each of the AND outputs S32 and S34 contains alternately clock pulses in a number proportional to the "1" level periods of each periodicity and each of the AND outputs S36 and S38 also contains alternately clock pulses in a number proportional to the "0" level periods of each periodicity. For example, the signal S32 contains clock pulses in a number proportional to the length of the "1" level period $C_1$ in one periodicity of the signal S28 and the signal S36 contains clock pulses in a number proportional to the length of the "0" level period $C_2$ in one period of the periodicity of the signal S28. In this manner, each period of the fundamental frequency-containing pulse signal S22 is converted into digital signals. Counters 40, 42, 44 and 46 respectively receive the AND gate outputs S32, S34, S36 and S38, count the number of input pulses and maintain the period information. The counters 40 and 42 respectively store the information of each "1" period in the mutually adjacent first and second cycles of the pulse signal S22 while the counters 44 and 46 respectively store the information of each "0" level period in the above-mentioned first and second cycles. Each counter 40, 42, 44 and 46 maintains the period information from the start of counting for the time corresponding to one period and is then reset to prepare for counting in a subsequent period.

The contents of the counters 40 and 44 (information indicating the "1" level period $C_1$ and the "0" level period $C_2$) are respectively transferred in parallel through gates 48 and 50 to the memories 52 and 54 at the timing of the signal S24 indicating each cycle of the signal S22 and stored therein. As described previously, these memories 52 and 54 are reset in advance by the reset signal S20 and respectively store the parallel data S48 and S50 in accordance with latch signals S62 and S64. It is to be hereby pointed out that although the signals S48 and S50 and the signals or data of the data contents $C_1$, $C_2$ sent from the counters 40 and 44 to the memories 52 and 54 are respectively generated in a parallel form in practice, they are shown in the serial form for illustrative purposes only in FIG. 5.

The latch signals S62 and S64 are respectively generated by the AND gates 62 and 64. The condition signals of the memories 52 and 54 are respectively applied through inverters 86 and 87 to input terminals of the AND gates 62 and 64. A timing signal (synchronized with the fall of the signal S28) obtained by inverting the signal S28 by the inverter 56 and differentiating the rise of the resulting signal by the differentiating circuit 58 is applied to the other input terminal of the AND gate 62, and a timing signal obtained by differentiating the rise of the signal S30 by the differentiating circuit 60 is applied to the other input terminal of the AND gate 64. For this reason, the latch signal S62 applied to the memory 52 is generated at the end of the "1" level period $C_1$ while the latch signal S64 supplied to the memory 54 is generated at the end of the "0" level period $C_2$. Accordingly, the memory 52 latches the first pulse group of the gate parallel output S48, that is, the time data corresponding to the "1" level period $C_1$ and does not store subsequent fresh data. Similarly, the memory 54 also latches the first pulse groups of the gate parallel output S50, that is, the time data corresponding to the "0" level period $C_2$, in synchronism with the end of the "0" level period $C_2$ and does not store the subsequent fresh data. The memory informations stored in this manner, i.e., the parallel outputs $M_1$ and $M_0$ of the memories 52 and 54, are respectively fed to digital comparators 66 and 68.

The digital comparators 66 and 68 respectively compare the memory outputs $M_1$ and $M_0$ with the parallel signals $N_1$ and $N_0$ indicating the other periods and generate coincidence signals S66 and S68 each time all parallel bits coincide. The parallel signals $N_1$ and $N_0$ to be respectively compared with the memory outputs $M_1$ and $M_0$ are generated respectively by gates 70 and 72. To the parallel input terminal of the gate 70 is applied the parallel signal S48 indicating the "1" level period of each periodicity at the timing of the signal S24. To the control input terminal of the gate 70 is applied a timing signal S76 (in synchronism with the fall of the signals 22) obtained by inverting the fundamental frequency-obtaining pulse signal S22 by an inverter 74 and differentiating the rise of the resulting signal by a differentiating circuit 76. The parallel signal S50 indicating the "0" level period of each periodicity at the timing of the signal S24 is applied to the other parallel input of the gate 72, and the timing signal S78 is applied to the control input terminal of the gate 72. The timing signal S78 is obtained by differentiating the rise of the fundamental frequency-containing pulse signal S22 by a differentiating circuit 78.

Accordingly, each parallel pulse group of the parallel signals S48 and S50 is transferred to the comparators 66 and 68 in the form of parallel signals $N_1$ and $N_0$ generated in synchronism with the rise and fall of the signal S22, and all of its parallel bits are respectively compared with the memory outputs $M_1$ and $M_0$. If all parallel bits coincide and hence, $M_1 = N_1$, the comparator 66 generates a coincidence signal S66. This signal S66 is used as a setting signal for setting an R-S flip-flop 80. Since the timing signal S76 is simultaneously applied to both control input terminal of the gate 70 and the reset terminal of the flip-flop 80, the signal S66 is generated considerably later in comparison to the timing signal S76 as a reset signal for the flip-flop 80 with such a time lag during which the gate control is effected by the gate 70 and comparison is performed by the comparator 66.

That is to say, the flip-flop 80 is first reset by the timing signal S76 (timing of the fall of the signal S22) and then set. Simultaneously with setting, the flip-flop 80 generates an output signal S80. In the comparator 68, on the other hand, the coincidence signal S68 is generated when $M_0 = N_0$ and this signal is fed to an AND gate 82 together with the output S80 of the flip-flop 80. The AND gate 82 generates a fundamental frequency pulse signal S84 at its output terminal 84 only when the comparator 68 generates the pulse S68 when the output S80 of the flip-flop 80 is at a high level. In other words, the fundamental frequency pulse signal S84 is not generated by the coincidence signal S66 alone or by the coincidence signal S68 alone, but is only generated when given both of these signals S66 and S68 (coincidence of the "1" level periods and that of the "0" level periods). In the abovementioned manner, it is possible to obtain the fundamental frequency pulse signal S84 corresponding to D in FIG. 1.

The above-described embodiment has the construction wherein the time interval of every one period of the fundamental frequency-containing pulse signal is individually detected with respect to the high level period and the low level period, stored and then compared. In order to simplify the circuit configuration, the comparison circuit section may be of such a type in which high level periods in every periodicity are first compared and the comparison of the low level periods are made only when coincidence is obtained in the high level periods.

For this purpose, for example, the AND gate 82 may be deleted in the circuit arrangement shown in FIG. 4 and an AND is taken between the flip-flop output S80 and the timing signal S78 (timing of the rise of the signal S22) so as to open the gate 72 by means of its AND output. In this case, the equality output S68 becomes the fundamental frequency pulse signal S84.

Next, the construction and action of the frequency deviation measuring device in accordance with the principle of action shown in FIG. 3 will be explained in further detail with reference to FIGS. 6 and 7.

In FIG. 6, the fundamental frequency pulse signal S84 is fed via an input terminal 90 to a frequency dividing circuit 92. This circuit comprises a programmable counter for which the frequency division ratio is suitably set by a frequency division ratio setter 91. FIG. 7 illustrates the frequency-divided fundamental frequency pulse signal S92 when the frequency division ratio is set to ½ and the following explanation of the operation deals with this case. The frequency division signal S92 is fed partly to one of input terminals of an AND gate 104 via an inverter 94 on one hand, and partly to one of the input terminals of an AND gate 96 and to a differentiating circuit 95, on the other hand.

A digital tone generator 100 equipped with twelve counters $CN_1$ through $CN_{12}$ respectively corresponding to twelve notes G# through A for counting clock pulses from a clock pulse source 98 is utilized. Each of the counters $CN_1$ through $CN_{12}$ supplies a pulse signal of a pulse width corresponding to the pitch of each of twelve notes to a multiplexer 102. For example, the pulse signal corresponding to the note A generated by the counter $CN_{12}$ has a pulse width of about 36.36 ms. The multiplexer 102 sequentially switches, in accordance with the control input S96, each output of the counters $CN_1$ through $CN_{12}$ in such a sequence that the pulse width changes unidirectionally (though this embodiment uses such a sequence that the pulse width changes in the increasing direction, the opposite may also be used), and converts it to a series signal as output. The series output S102 is applied to the other input terminal of the AND gate 104 and the other input terminal of the AND gate 96 through an inverter 117. The counters $CN_1$ through $CN_{12}$ are synchronized with one another by a timing signal (pulse synchronized with the rise of the signal S92) generated by the differentiation circuit 95, and generates a pulse in synchronism with the rise of the signal S92.

Now, the explanation is given how the pulses respectively corresponding to the G# note, G note and F# note are generated sequentially as a series output S102 as shown in FIG. 7. The G#-corresponding pulse is first subjected to the AND operation with the pulse signal S92 at the AND gate 96, thus generating a control pulse S96 having a pulse width corresponding to the difference of their pulse widths. This pulse S96 in turn controls the multiplexer 102 so as to generate the subsequent G-corresponding pulse as an output. Since the G-corresponding pulse also has a pulse width narrower than that of the pulse S92, it again generates the control pulse S96. In this manner, the control pulse S96 is generated till the difference of pulse width between the pulse S92 and the reference tone-corresponding pulse becomes minimum. When the pulse S92 encounters a reference tone pulse having a pulse width wider than that of the pulse S92, the control pulse S96 is no longer generated whereby the multiplexer 102 retains the reference tone pulse at that time.

If the pulse S92 does not encounter a reference tone pulse having a pulse width wider than that of the pulse S92 even by changing the output from the output of the counter $CN_1$ (i.e., G#-corresponding pulse) to the output of the counter $CN_{12}$ (i.e., A-corresponding pulse), it means that there is a frequency deviation substantially exceeding one octave. In this case, the frequency division ratio of the pulse signal S84 is changed in order to change the octave to which notes G# through A belong. Then pulse width comparison is carried out in the same way as above.

If, in this example the reference pulse corresponding to the note F# is processed of a width wider than the pulse S92, the control pulse S94 is not generated when the F#-corresponding pulse is applied and the multiplexer 102 retains the F#-corresponding pulse as its output S102. In the AND gate 104, an AND is taken between the inverted signal $\overline{S92}$ and the output S102 and an AND output S104 is generated in the form of a pulse having a pulse width that corresponds to the difference of the pulse width between the pulse S92 and the F#-corresponding pulse.

A decoder 106 decodes the switching condition of the multiplexer 102 so as to discriminate the name of the note and generates a note name output signal. This note name output signal is applied to a frequency division circuit 108 and changes the frequency division ratio so as to correspond to the note name thus discriminated. The frequency division circuit 108 divides the frequency of the clock pulse from the clock pulse source 98 in accordance with a control input consisting of the output of the decoder 106 and generates a cent value-corresponding pulse corresponding to each note name. In the aforementioned example, the decoder 106 detects the F# tone and, consequently, the frequency division circuit 108 generates such a cent value-corresponding pulse that corresponds to the F# tone.

The output S104 of the AND gate 104 and the output of the frequency division circuit 108 are applied as input to an AND gate 110 and subjected to the AND operation, thereby providing an AND output S110 as shown in FIG. 7. By counting this AND output S110 by a counter 112, it is possible to generate a deviation signal which expresses the difference of the frequency between the fundamental wave and the reference note in terms of a cent value. The deviation signal generated in this manner is latched by a latch circuit 114 and visibly displayed on a display 116. It is also possible to simultaneously display the octave name and the note name on the display 116 by leading the output of the frequency division ratio setter 91 and that of the decoder 106 to the display 116.

In practicing the tuning using the abovementioned tuning apparatus of the present invention, the cent deviation, the octave name and the tone name can be expressed on that display simply by applying the sound or tone to be tuned to the acoustic-electric converter. On the basis of this display, tuning can be made accurately and rapidly by turning a tuning knob. In the case of a natural musical instrument such as a piano, for instance, tuning can be made by turning a tuning pin until the cent value becomes zero on the display while playing each key. In a piano, it is frequently required to tune or temper the low range tones lower and the high range tones higher than the temperament curve. Such peculiar tuning is also made easily in accordance with a deviation quantity corresponding to each tone because the cent diviation is directly indicated on the display. Accordingly, even an utter amateur can perform tuning accurately and rapidly.

Tuning of an electronic musical instrument ca be made in exactly the same way as in the natural musical instrument.

It should be apparent to one skilled in the art that the above described embodiments are merely a few of the many specific embodiments which represent the application of the principles of the present invention. Numerous and varied other embodiments can be readily devised by those skilled in the art without departing from the spirit and scope of the present invention.

I claim:

1. A tuning apparatus which comprises:
   fundamental frequency detection means for detecting an objective signal to be tuned and generating a fundamental frequency pulse signal having a frequency corresponding to the fundamental frequency of said objective signal;
   converter means for converting said fundamental frequency pulse signal to a first pulse signal having a pulse width corresponding to said fundamental frequency;
   means for generating a second pulse signal having a pulse width corresponding to the frequency of a reference tone;
   means for comparing the pulse width of said first and second pulse signals and generating a third pulse signal having a pulse width corresponding to the difference therebetween;
   means for generating cent value-corresponding pulses having a frequency so selected as to indicate a cent value with respect to said reference tone; and
   means for counting said cent value-corresponding pulses in the period corresponding to the pulse width of said third pulse signal and generating a deviation signal expressing the deviation of frequency between said fundamental frequency pulse signal and said second pulse signal in terms of a cent value.

2. A tuning apparatus according to claim 1 wherein said fundamental frequency detection means includes means for detecting a peak value of said objective signal and holding said objective signal; comparator means for comparing said held value with an instantaneous value of said objective signal and generating a fundamental frequency-containing pulse signal consisting of pulses corresponding to peak positions of said objective signal; and circuit means for detecting a feature of said fundamental frequency-containing pulse signal repeatedly appearing with a certain periodicity corresponding to said fundamental frequency of said objective signal and generating said fundamental frequency pulse signal.

3. A tuning apparatus according to claim 2 wherein said comparator means is arranged and configured to generate a high level pulse in said fundamental frequency-containing pulse signal when and during said instantaneous value of said objective signal reaches said held value; and said circuit means includes a detection circuit for detecting a high level period and a low level period of each adjacent pair of high and low levels of said fundamental frequency-containing pulse signal, a memory circuit for memorizing said high level period and said low level period of at least one adjacent pair of high and low levels of said fundamental frequency containing pulse signal, and a comparison circuit sequentially comparing said memorized high and low level periods with succeeding high and low level periods of said fundamental frequency-containing pulse signal respectively and generating a coincidence pulse when the corresponding level periods coincide with each other whereby a train of said coincidence pulses thus obtained forms said fundamental frequency pulse signal.

4. A tuning apparatus which comprises:
means for detecting an objective signal to be tuned and for generating a fundamental frequency pulse signal having a frequency corresponding to the fundamental frequency of said objective signal;
means for converting said fundamental frequency. pulse signal to a first signal having a pulse width corresponding to said fundamental frequency;
means for generating a plurality of second pulse signals each having a pulse width determined in accordance with each of note names of a plurality of reference tones;
first comparater means for comparing the pulse width of said first pulse signal with those of other input signals and generating a control pulse when the difference therebetween becomes a minimum;
second comparater means for comparing the pulse width of said first pulse signal with those of other input signals and generating a third pulse signal having a pulse width corresponding to the difference therebetween;
means for sequentially supplying said first and second comparater means respectively with said plurality of second pulse signals as said other input signals in such a manner that the pulse width thereof changes in accordance with the order of said note names, and retaining a specific second pulse signal first supplied after generation of said control pulse;
means for generating a cent value-corresponding pulse having a frequency so selected as to indicate a cent value in accordance with the note name corresponding to said specific second pulse signal; and
means for counting said cent value-corresponding pulses during the period corresponding to the pulse width of said third pulse signal and generating a deviation signal indicating a frequency deviation between said fundamental frequency pulse signal and said specific second pulse signal in terms of a cent value.

* * * * *